United States Patent [19]
Blalock et al.

[11] Patent Number: 5,416,048
[45] Date of Patent: May 16, 1995

[54] METHOD TO SLOPE CONDUCTOR PROFILE PRIOR TO DIELECTRIC DEPOSITION TO IMPROVE DIELECTRIC STEP-COVERAGE

[75] Inventors: Guy T. Blalock; Trung T. Doan, both of Boise, Id.

[73] Assignee: Micron Semiconductor, Inc., Boise, Id.

[21] Appl. No.: 49,044

[22] Filed: Apr. 16, 1993

[51] Int. Cl.$^6$ .......................... H01L 21/465; C23C 14; C23C 34

[52] U.S. Cl. ................ 437/228; 204/192.32; 204/192.35; 437/235; 437/246

[58] Field of Search ............... 437/225, 228, 245, 235; 204/192.32, 192.3, 192.35; 156/643, 656, 664, 665, 666

[56] References Cited

U.S. PATENT DOCUMENTS

| | | | |
|---|---|---|---|
| 4,125,446 | 11/1978 | Hartsough et al. | 204/192.15 X |
| 4,444,635 | 4/1984 | Kobayashi et al. | 204/192.12 X |
| 4,523,372 | 6/1985 | Balda et al. | 156/646 |
| 5,089,442 | 2/1992 | Olmer | 204/192.3 X |
| 5,203,957 | 4/1993 | Yoo et al. | 204/192.35 X |
| 5,252,520 | 10/1993 | Kocmanek et al. | 437/228 X |
| 5,344,797 | 9/1994 | Pai et al. | 437/228 X |

OTHER PUBLICATIONS

Stanley Wolf and Richard N. Tauber, *Silicon Processing For The VLSI ERA Vol. 1: Process Technology*, 1986, pp. 366–367.

Peter Van Zant, *Microchip Fabrication*, 1990, pp. 344–351.

*Primary Examiner*—Nam Nguyen
*Attorney, Agent, or Firm*—Lia M. Pappas

[57] ABSTRACT

A process for semiconductor manufacture in which the top corners of conductive features are preferentially etched compared to the etch rate of the vertical and horizontal surfaces, thereby creating a sloped (prograde) profile, i.e., facets. The material removed through the sputter etch process is oxidized and redeposited along the sides of the feature and along the surface of the substrate, thereby improving step coverage when a subsequent dielectric layer is deposited thereon.

20 Claims, 2 Drawing Sheets

5,416,048

METHOD TO SLOPE CONDUCTOR PROFILE PRIOR TO DIELECTRIC DEPOSITION TO IMPROVE DIELECTRIC STEP-COVERAGE

FIELD OF THE INVENTION

This invention relates to semiconductor manufacture, and more particularly to facet etching useful for improving subsequent dielectric layer step-coverage.

BACKGROUND OF THE INVENTION

A major goal of any dielectric deposition system is good step-coverage. Step-coverage refers to the ability of subsequent layers to evenly cover levels ("steps") already present on the substrate.

A problem arises when material from a point source is shadowed by "steps" on the substrate surface. The result can be that sections of the deposited layer can be too thin or have a void, i.e., "keyhole." A "keyhole" is a profile which is characterized by the presence of an unwanted void in a layer of deposited material, as seen in FIG. 1.

These effects are aggravated if the slope of the underlying profile is retrograde. Deposition of a nonconformal material onto a feature having a retrograde profile frequently results in a re-entrant profile, often accompanied by a "keyhole." As cell dimension sizes get smaller, and features are placed closer and closer together, the problem of "keyhole" formation will become greater.

The problem is also aggravated by an increase in aspect ratio (height to width ratio) of the feature. As the aspect ratio increases beyond 3:1, the profile becomes more retrograde, and the step coverage of the subsequently deposited film degrades.

Reactive ion sputter etching has been found to have a characteristic etch pattern. Sputter etch yields display angular dependency. This etch pattern makes reactive ion sputter etching a useful tool in forming faceted edges. The graph in FIG. 2 illustrates the Etch Angle versus Yield of the Etch. From the figure, it should be apparent that the Yield is highest at an angle of approximately 45°. FIG. 3 illustrates the facet which results at the edges of a feature formed during the etch process. The facet angle is also approximately 45°.

In sputter etch, ions which impinge on horizontal surfaces have a minimal effect on etch rate and profile. However, the sputter yield of the etch at the corners is approximately four times that of the etch rate of a horizontal surface, thereby creating an extreme etch profile. The effect is the wearing, away of the corners of a feature at approximately 45° angles. The material removed by the sputter etch is redeposited along the sides of the feature and along the surface of the substrate.

The amount of material redeposited is also effected by the actual shape of the feature being etched. Prograde and retrograde profiles tend to etch differently.

There are problems associated with the sputter of a conductive material. Material sputtered from the top corners of several conductive features may redeposit too far along the substrate between the features. If this material is allowed to remain conductive, an unwanted electrical short can be created between the features. Consequently, the tendency in the industry is to avoid sputter etching of conductive materials.

However, sputter etching is used extensively in planarization; e.g., in a bias sputter quartz (BSQ) process involving deposition/etch/deposition technology.

Known processes for depositing dielectrics use the sequence of an oxide deposition step, followed by facet etching of the deposited oxide, and another deposition step. This sequence involves the introduction of three additional processing steps, and the associated increases in manufacturing costs. The first oxide deposition further increases the aspect ratio of the feature.

Furthermore, known methods employing the sequence of an oxide deposition step, followed by a dry etch step, do not provide any significant degree of slope angle creation, and therefore can not reduce the aspect ratio by any significant amount. Hence, the known methods can not provide the step-coverage necessary for effective filling of mid-submicron features.

SUMMARY OF THE INVENTION

The process of the present invention employs a reactive ion sputter etch to create a profile which improves step coverage of subsequently deposited dielectric layers. The redeposited material grades the feature profile, thereby enabling a more uniform deposition of subsequent layers. The process is especially useful for depositing layers superjacent conductive features which are disposed in close proximity to one another.

The process of the present invention creates a reduced aspect ratio prograde profile from the conductive feature itself. In the present invention, the top corners of the conductive feature are preferentially faceted during a sputter etch, as compared to the etch obtained on planar vertical and horizontal surfaces. This creates a low angle (45°) slope or facet on the top corners thereby increasing the total profile slope and effectively reducing the aspect ratio.

The process of the present invention uses sputtering of a metallic feature to improve the step-coverage of the subsequent dielectric layer by oxidizing and redepositing the sputtered material along the sides of the feature and along the surface of the substrate. By oxidizing the material as it is sputtered off the conductive feature, the potential for adjacent features to short together is significantly decreased.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

For purposes of this application, "feature" refers to any geometric structure disposed on a semiconductor wafer. The Feature includes, but is not limited to metal lines, interconnects, capacitors, gates, nodes, etc.

Figure 1:
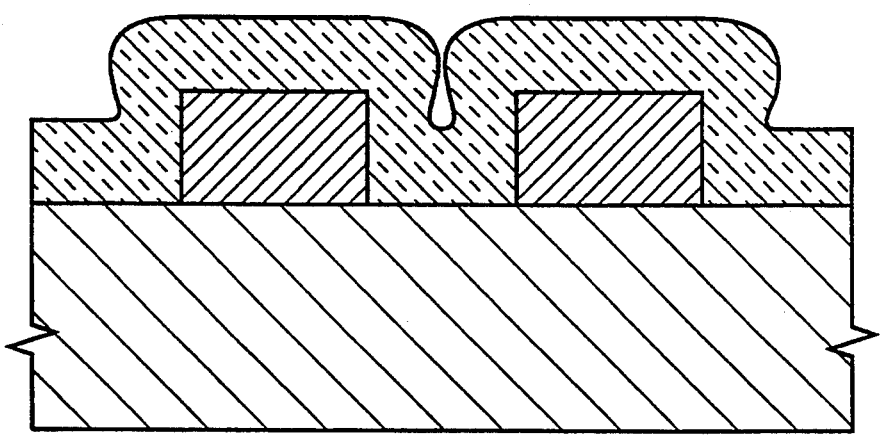
FIG. 1 is a schematic cross-section of the prior art problem of a deposition layer "keyhole" between closely spaced features.
Figure 2:
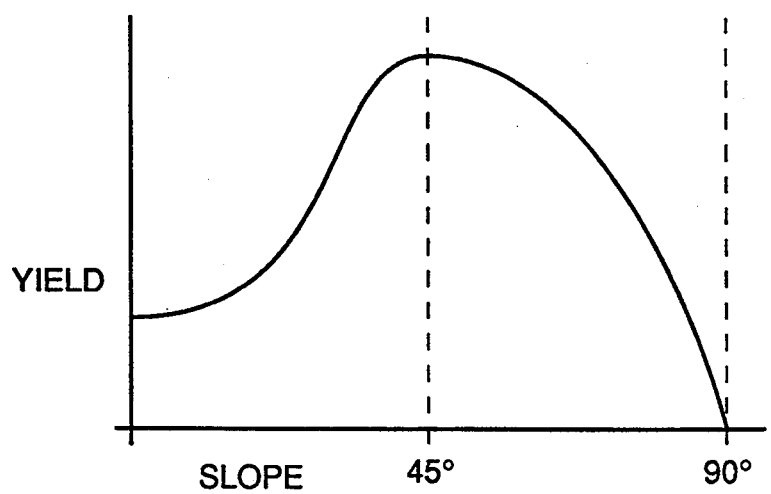
FIG. 2 is a graph of Yield versus Etch Angle for a reactive ion sputter etch.
Figure 3:
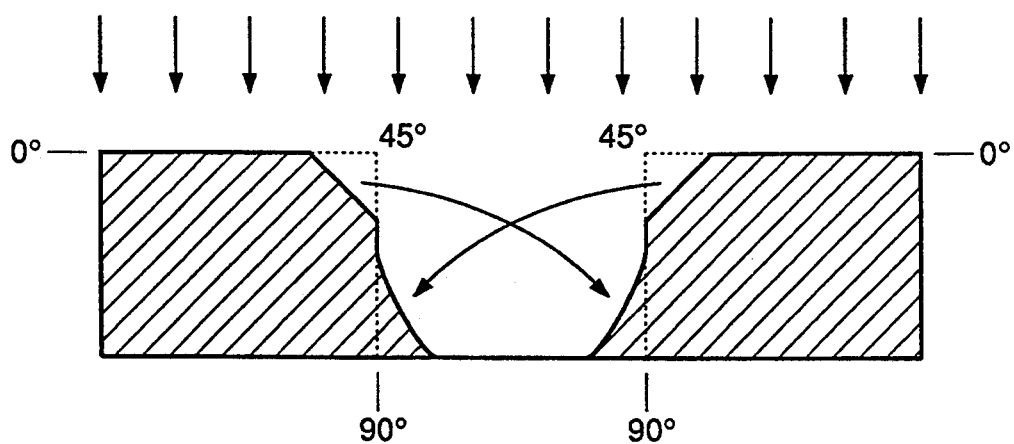
FIG. 3 is a schematic diagram of the angle of ion impingement on a material used in the manufacture of an integrated circuit, and the consequent shape of the structure upon removal of material.
Figure 4:
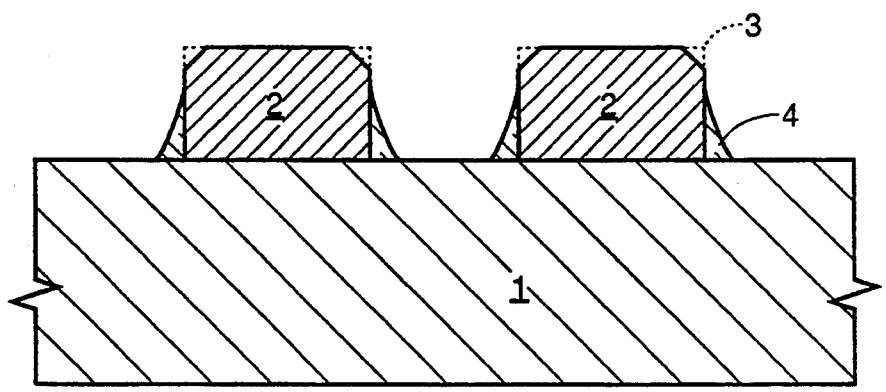
FIG. 4 is a schematic cross-section of a feature which has been etched, according to the process of the present invention, further indicating the shape of the feature prior to the etch with dotted lines.

In FIG. 4, the dotted lines 3 indicate the geometric feature 2 before any material 3 was removed by the process of the present invention. The structures 2 are often formed by a patterning and etch process. The profile of the geometric feature 2 is most commonly retrograde or substantially normal to the substrate or surface 1 on which structure 2 is disposed.

The solid lines indicate the change in the geometric shape 2 after the conductive material 3 has been sputtered, and subsequently redeposited as an oxidized film 4 along the lower sides of the feature 2. The faceted top corners 3 of the profile, in addition to the slope created by the oxidized low angle redeposition of material 4, create a profile which improves the step-coverage ability of the next layer 5 of film deposition. The redeposited material 4, upon oxidization, converts into an insulator 4.

In the preferred embodiment of the present invention, aluminum structures 2 are used to form the conductive lines 2 for an integrated circuit. However, the preferred embodiment is simply illustrative; the process of the present invention being useful in other circumstances in which a non-conformal or other layer is deposited.

The process of the present invention comprises the creation of a prograde (i.e., faceted) structural profile, in lieu of the retrograde profile. The top corners 3 of the structures 2 are preferentially etched compared to the etch rate of the vertical and horizontal surfaces, thereby creating slopes, i.e., facets.

In the preferred embodiment, the geometric feature 2 is disposed on a substrate 1. The substrate 1 can be a wafer comprised of silicon or other semiconductor material. The substrate 1 can also comprise a material layer disposed on a semiconductor wafer, which layer is used in the manufacture of integrated circuits, depending on the stage of production at which the process of the present invention is employed.

The feature 2, preferably comprises a conductive material, and is etched according to the process of the present invention, resulting in a structure 2 having faceted edges. Any suitable material can be etched using the sputter process of the present invention. The preferable materials form stable insulating compounds when oxidized. Such materials are usually conductive, and include, but are not limited to metals and polysilicon. The preferred embodiment employs aluminum (Al), as aluminum forms a stable dielectric (i.e., $Al_2O_3$) when oxidized.

Aluminum is a metal with a very high chemical reactivity, and will react very readily with atmospheric oxygen. This extreme susceptibility to oxidation is employed in the process of the present invention to convert the sputtered conductive film 3 into an insulative redeposited layer 4. The sputtered material 3 reacts much more with the oxidizing gas present in the plasma, compared to the conductive feature 2. The redeposited material 4 is in the approximate range of 200–500Å, as compared to any oxidation of the feature 2 which may be in the approximate range of 5–20Å.

The etch of the present invention has a basis in the physical nature of the reaction, more specifically in ion bombardment. Hence, the process of the present invention is most effective when performed in a chamber in which ions can be accelerated. Such chambers are known in the art, and include, but are not limited to, Reactive Ion Etchers (R.I.E.), preferably magnetically enhanced reactive ion etchers, and high density source etchers.

The facet etch is preferably performed by placing the desired substrate 1 in a high vacuum reactor on a cathode for which a power source creates a radio frequency (RF) of 13.56 Mhz, while controlling the introduction of the etchant gases.

The walls of the reactor are grounded to allow for a return RF path. This chamber configuration is generally referred to as a Reactive Ion Etcher (R.I.E.). The RF power source acts to create a plasma condition within the chamber, thereby allowing for the creation of charged particles or ions.

Due to the physics of the RF powered electrode, a direct current self-bias voltage condition is created at the substrate 1 location. This self-bias condition acts to direct the charged particles or ions toward the wafer 1 in a direction perpendicular to the wafer surface 1.

If the pressure is in a range being slightly less than 30 mtorr, the mean free path of the charged particles or ions will be great enough to allow for physical sputtering of substrate material 1 when the ions impinge on the surface of the substrate 1. It is important to note that a wide variety of systems and parameters can be used to effect a facet etch, as long as the pressure limit is not violated. As the pressure nears and exceeds 30 mtorr, the results of the process are effected.

Typical parameters for facet etching using an Applied Materials 5000 Series equipment are as follows:
  RF power: 300–700 watts
  pressure: 10–30 mtorr
  etchant: 30–70 sccm.

Inert gases, including but not limited to, argon (Ar) and xenon (Xe) are effective etchant gases for performing the facet etch. The inert gas tends to further enhance the uniformity of the etch process. Argon is preferred because of its weight and commercial availability, but the other inert gases can also be used.

In order to achieve the necessary oxidation of the sputtered conductive material, an oxidizing gas (preferably oxygen) must be introduced into the plasma. The oxygen should be added at low levels in order to avoid a loss of sputter rate from rapid aluminum oxidation, since the sputter yield of aluminum oxide ($Al_2O_3$) is lower than the sputter yield of pure aluminum. A ratio of etchant chemicals of approximately 10:1 for sputter gas components to oxygen is within a functional range. In this manner, the sputtered aluminum 3 will be converted to $Al_2O_3$ as it travels to the redeposition site 4, or will be converted after it reaches the redeposition site 4.

Oxygen is the preferred oxidizing gas added to the plasma in the process of the present invention. However, other suitable oxidizing agents, such as, but not limited to, nitrogen, can also be used.

The area 4 of redeposited aluminum (Al) along the substrate 1 is left exposed, which allows the formation of insulating aluminum oxide ($Al_2O_3$) over the area where the subsequent layer 5 is disposed. This improves the step-coverage of the next layer 5, as the angles at which the layer 5 is deposited are not as severe as they would be otherwise, and furthermore there is less "shadowing."

Figure 5:
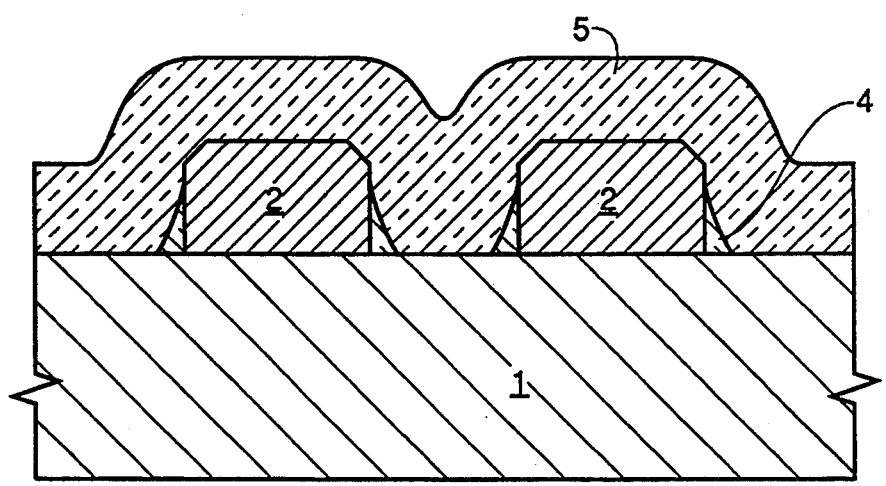
FIG. 5 is a schematic cross-section of the feature of FIG. 3, after a dielectric layer has been disposed upon the feature, according to the process of the present invention.

FIG. 5 illustrates the degree of step-coverage possible with the subsequent deposition of a dielectric layer 5 when employing the process of the present invention. The redeposited material 4 in the corners of the metal lines 2 enables a more uniform blanketing of the superjacent layer 5. The layer 5 is deposited by any suitable method known in the art.

The process of the present invention is useful in the metallization process wherein unwanted portions of a metal layer are removed by a conventional photomasking and etch procedure or by lift-off. The surface 1 left behind is covered with thin lines 2 of metal that are referred to as "leads," "metal lines," or "interconnects." Subsequently, a layer of some dielectric material, referred to as an intermetallic dielectric 5, is deposited. This dielectric 5 may comprise a deposited oxide, silicon nitride, a polyimide film, or other suitable insulating material.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that facet etching according to the process of the present invention can be used on a variety of structures upon which subsequent layers are deposited in order to improve step-coverage.

What is claimed is:

1. A method of forming a sloped profile comprising the following steps of:
    removing material from a plurality of conductive structures, said structures having sides and corners, said material being removed at a prescribed angle from said corners, said material being redeposited along said sides of said structures adjacent thereto; and
    converting said redeposited material into an insulator.

2. The method according to claim 1, wherein said removal comprises Reactive Ion Etching (R.I.E.), said etching comprising a plasma, said plasma comprising an inert gas and an oxidizing gas.

3. The method according to claim 2, wherein said inert gas comprises argon and said oxidizing gas comprises at least one of oxygen and nitrogen.

4. The method according to claim 3, wherein said conductive structures comprise aluminum.

5. The method according to claim 4, wherein said conductive structures form at least one of metal lines, interconnects, and leads.

6. The method according to claim 5, wherein said prescribed angle is in the approximate range of 45°.

7. A method for improving dielectric step-coverage comprising the following steps of:
    removing material from conductive features disposed on a substrate, said features being disposed in close proximity to one another, said features having corners and sides, said sides forming angles with said substrate, said material being removed at a prescribed angle from said corners and being redeposited in said substrate angles of said proximate features, thereby sloping said angles; and
    disposing a dielectric layer superjacent said features, said layer blanketing said sloped angles, thereby substantially filling said close proximity.

8. The method according to claim 7, wherein said removal comprises etching said features with a plasma, said plasma comprising a sputtering agent and an oxidizing gas.

9. The method according to claim 8, wherein said sputtering agent comprises an inert gas, and said oxidizing gas comprises oxygen.

10. The method according to claim 9, wherein said dielectric comprises at least one of a deposited oxide, silicon nitride, or a polyimide film.

11. The method according to claim 10, wherein said features comprise at least one of a metal line, an interconnect, and a lead.

12. The method according to claim 11, wherein said features comprise a metal which forms a stable dielectric upon oxidation.

13. The method according to claim 8, wherein said sputtering agent comprises an inert gas, and said oxidizing gas comprises nitrogen.

14. A process for forming a pro-grade profile comprising the following steps of:
    forward sputtering closely spaced metal features using an inert gas and an oxidizing gas, said forward sputtering forming prescribed angles in said metal features, said feature comprising sides, said sides being substantially normal to a substrate;
    redepositing material from said forward sputtering along said sides of another of said features and along said substrate, thereby grading said profile of said features, said material being oxidized; and
    depositing a dielectric superjacent said substrate and said graded profile of said features, said dielectric filling said close space.

15. The process according to claim 14, wherein said sputtering comprises a plasma, said plasma comprising argon and oxygen.

16. The process according to claim 14, wherein said plasma is generated in a Reactive Ion Etcher.

17. The process according to claim 16, wherein said features comprise at least one of interconnects, metal lines, and leads.

18. The process according to claim 17, wherein said dielectric uniformly covers said graded profiles.

19. The process according to claim 18, wherein said dielectric comprising at least one of a deposited silicon, silicon nitride, and polyimide.

20. The process according to claim 14, wherein said profile of said features becomes faceted by said sputtering, said facet having an angle of approximately 45°.

* * * * *